(12) United States Patent
Vest et al.

(10) Patent No.: US 6,184,703 B1
(45) Date of Patent: Feb. 6, 2001

(54) METHOD AND CIRCUIT FOR REDUCING OUTPUT GROUND AND POWER BOUNCE NOISE

(75) Inventors: William B. Vest, Santa Clara; Dirk A. Reese, San Jose; Myron W. Wong, San Jose; John C. Costello, San Jose, all of CA (US)

(73) Assignee: Altera Corporation, San Jose, CA (US)

( * ) Notice: Under 35 U.S.C. 154(b), the term of this patent shall be extended for 0 days.

(21) Appl. No.: 09/092,240

(22) Filed: Jun. 5, 1998

Related U.S. Application Data

(60) Provisional application No. 60/048,887, filed on Jun. 6, 1997.

(51) Int. Cl.[7] .................................................. H03K 17/16
(52) U.S. Cl. .................................. 326/27; 326/83; 326/86
(58) Field of Search ................................. 326/33, 21, 26, 326/27, 83, 86; 327/375

(56) References Cited

U.S. PATENT DOCUMENTS

| | | |
|---|---|---|
| 4,782,252 | 11/1988 | Levy et al. . |
| 4,857,770 | 8/1989 | Partovi et al. . |
| 5,121,000 | 6/1992 | Naghshineh . |
| 5,121,013 * | 6/1992 | Chuang et al. ............... 326/26 |
| 5,151,621 * | 9/1992 | Goto ............................. 326/86 |
| 5,189,322 | 2/1993 | Chan et al. . |
| 5,241,221 * | 8/1993 | Fletcher et al. ............... 326/21 |
| 5,315,187 * | 5/1994 | Cheng ........................... 326/27 |
| 5,537,060 * | 7/1996 | Baek ............................. 326/27 |
| 5,604,453 | 2/1997 | Pedersen . |
| 5,760,634 * | 6/1998 | Fu ................................. 326/27 |
| 5,894,238 * | 4/1999 | Chien ............................ 326/27 |

* cited by examiner

Primary Examiner—Michael Tokar
Assistant Examiner—Don Phu Le
(74) Attorney, Agent, or Firm—Townsend and Townsend and Crew LLP

(57) ABSTRACT

An output buffer comprising control circuit for reducing the amount of ground and/or power bounce noise. The output buffer further includes one or more driver devices. The output current of the driver device(s) is limited by providing an intermediate drive voltage to the control electrode of the driver device. A pass device (or a transmission gate) provides the intermediate drive voltage and also operates as a variable resistive device that limits the slew rate of the drive voltage. The operation of the pass device can be dependent on a signal level at the output of the output buffer. When the output has transitioned to a new logic state, the new logic level is fed back to change the operating state of the pass device, thus ensuring that the output voltage meets the output VOL and VOH specifications.

41 Claims, 3 Drawing Sheets

METHOD AND CIRCUIT FOR REDUCING OUTPUT GROUND AND POWER BOUNCE NOISE

This application claims the benefit of a U.S. provisional Application No. 60/048,887, filed Jun. 6, 1997, which is incorporated herein by reference.

BACKGROUND OF THE INVENTION

This invention relates generally to digital circuits. More particularly, it relates to an output buffer including control circuits for reducing power and/or ground bounce noise.

Digital logic circuits are widely used in the areas of electronics and computer-type equipment. One such use of digital logic circuits is to provide an interface function between one logic type (i.e., CMOS) of one integrated circuit device and another logic type (i.e., TTL) of another integrated circuit device. An output buffer is an important component for performing this interface function. The output buffer generates, when enabled, an output signal that is a function of a data input signal received from other logic circuitry of the integrated circuit.

An output buffer circuit typically uses a pull-up and a pull-down field-effect transistor coupled in series between first and second power supply terminals. The first power supply terminal may be supplied with a positive potential which is coupled to an internal power supply potential node. The second power supply terminal may be supplied with a ground potential, which is coupled to an internal ground potential node. The connection point of the pull-up and pull-down field-effect transistors is further joined to an output terminal.

Dependent upon the logic state of the data input signal and an enable signal, either the pull-up or pull-down field-effect transistor is quickly turned on and the other transistor is turned off. Such rapid switching, on and off, of the pull-up and pull-down field-effect transistors causes sudden surges of current which create what is commonly known as current spikes. These current spikes flow through the impedance and inductive components of power supply lines and cause inductive noise at the internal power supply potential and the internal ground potential nodes of the output buffer. In particular, when the pull-down transistor is quickly turned on, a large instantaneous current cooperates with the line inductance to pull up the internal ground potential. This phenomenon is referred to as "ground bounce" noise. Similarly, when the pull-up transistor is quickly turned on, there may be "power bounce" noise on the internal power potential.

Therefore, it is desirable to provide a control circuit which limits the output current of the output buffer during transitions between logic states to reduce ground and/or power bounce noise, but yet maintains a high speed of operation. Further, it is desirable that the output buffer meets the DC specifications, such as the high output voltage (VOH) and the low output voltage (VOL) specifications.

SUMMARY OF THE INVENTION

The present invention is an output buffer that includes control circuits for reducing the amount of ground or power bounce noise, or both. The output buffer includes a driver circuit having one or more driver devices. One such driver circuit is a push-pull circuit having a pull-up and a pull-down driver coupled in series between two power supply terminals. In the present invention, the output current of the driver devices is limited to reduce ground or power bounce noise, or both.

In one embodiment of the present invention, the output current of the driver devices is limited by providing intermediate voltages to the control electrodes of the driver devices. The data input signal is provided to the input of a pass device (or a transmission gate) within the control circuit. At least one control node of the pass device can be coupled to an intermediate voltage that is between the voltages of the power supply terminals. The pass device limits the drive voltage to the driver device (to approximately the value of the intermediate voltage) and results in less output drive current, thus reducing bounce noise. Additionally, the intermediate voltage at the control node causes the pass device to operate as a variable resistive device, which correspondingly limits the slew rate of the drive voltage to the driver device. The slew rate limited drive voltage also limits the slew rate of the output current, further reducing in the amount of bounce noise.

The control circuit for the pull-down driver can be operated to reduce the amount of ground bounce noise. Similarly, the control circuit for the pull-up driver can be operated to reduce the amount of power bounce noise. The output buffer can include control circuits for reducing ground bounce, power bounce, or both ground and power bounce noise.

In one aspect of the present invention, the control circuit accepts a feedback signal from the output of the output buffer. When the drive of the pass device is reduced (to limit the output current) and upon transition of the output to a new logic state, the new logic value is fed back to the control circuit and used to change the operating state of the pass device. This feedback mechanism allows control over the amount of reduction in bounce noise and ensures that the output voltage of the output buffer meets the output VOL and VOH specifications.

In another aspect of the present invention, the control circuit is only turned on during a logic transition (e.g., logic low to logic high, or logic high to logic low) and only for the driver device which is being turned on. The slew rate limitation is not enabled when the driver is turned off. This feature reduces the time both pull-up and pull-down drivers are simultaneously turned on.

In one set of embodiments, the output current control feature is incorporated into the design of the output buffer. In another set of embodiments, the output current control feature is provided by a SLEW control signal that provides for programmability of the inventive feature.

For a further understanding of the nature and advantages of the invention, reference should be made to the ensuing detailed description taken in conjunction with the accompanying drawings.

DETAILED DESCRIPTION OF THE SPECIFIC EMBODIMENTS

Figure 1:
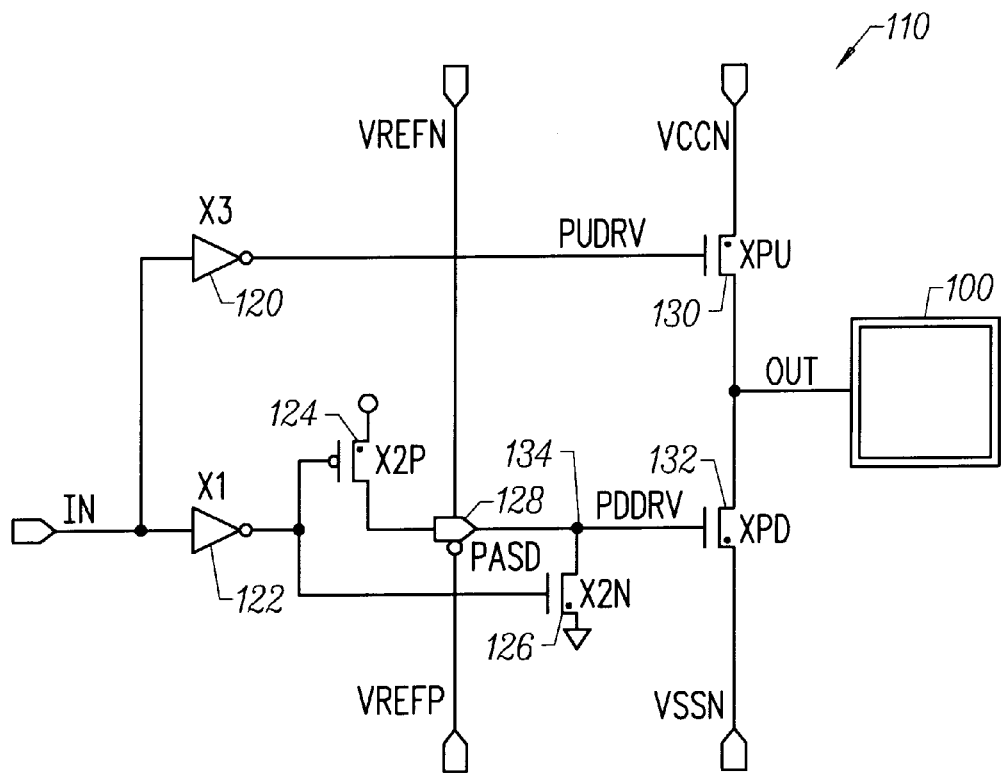
FIG. 1 is a simplified schematic diagram of an inverting output buffer.
Figure 3:
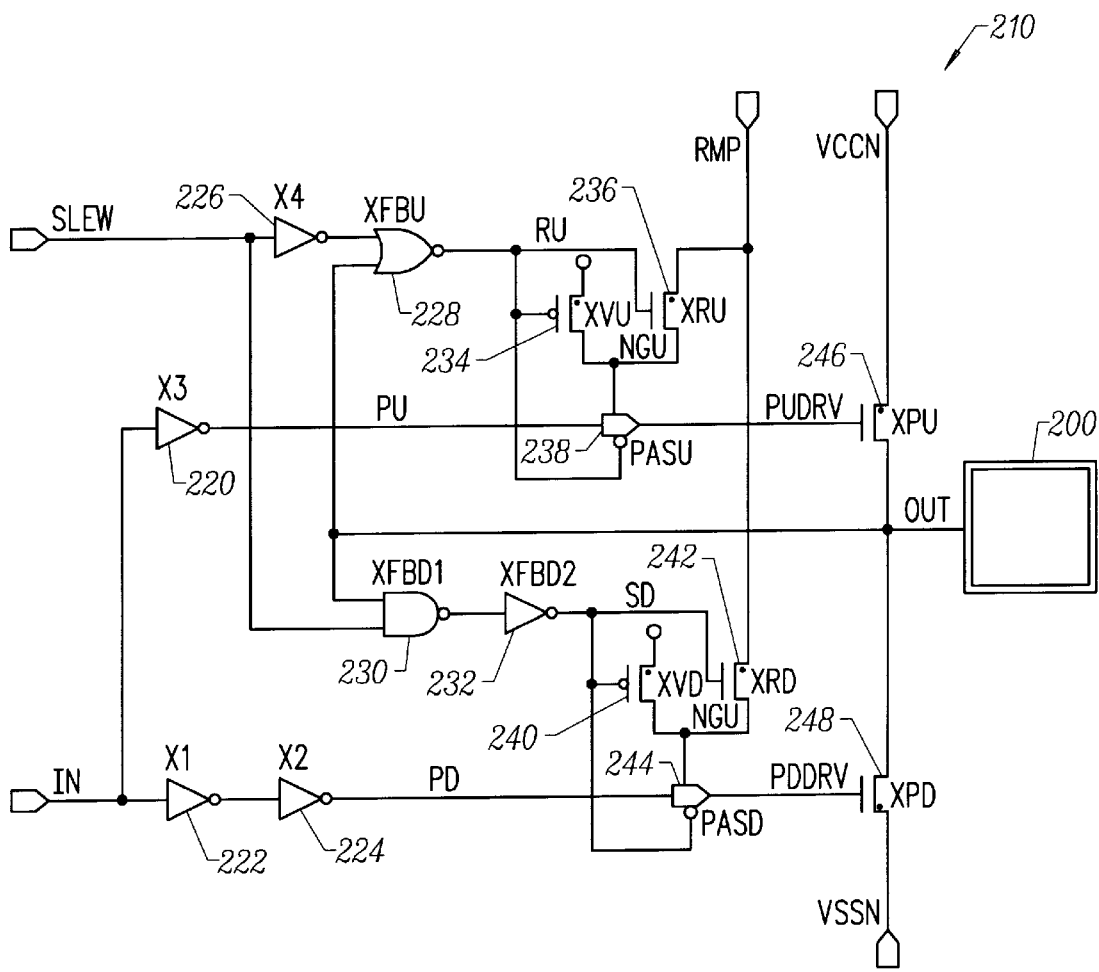
FIG. 3 is a simplified schematic diagram of an output buffer with ground bounce and power bounce reduction circuits.
Figure 4:
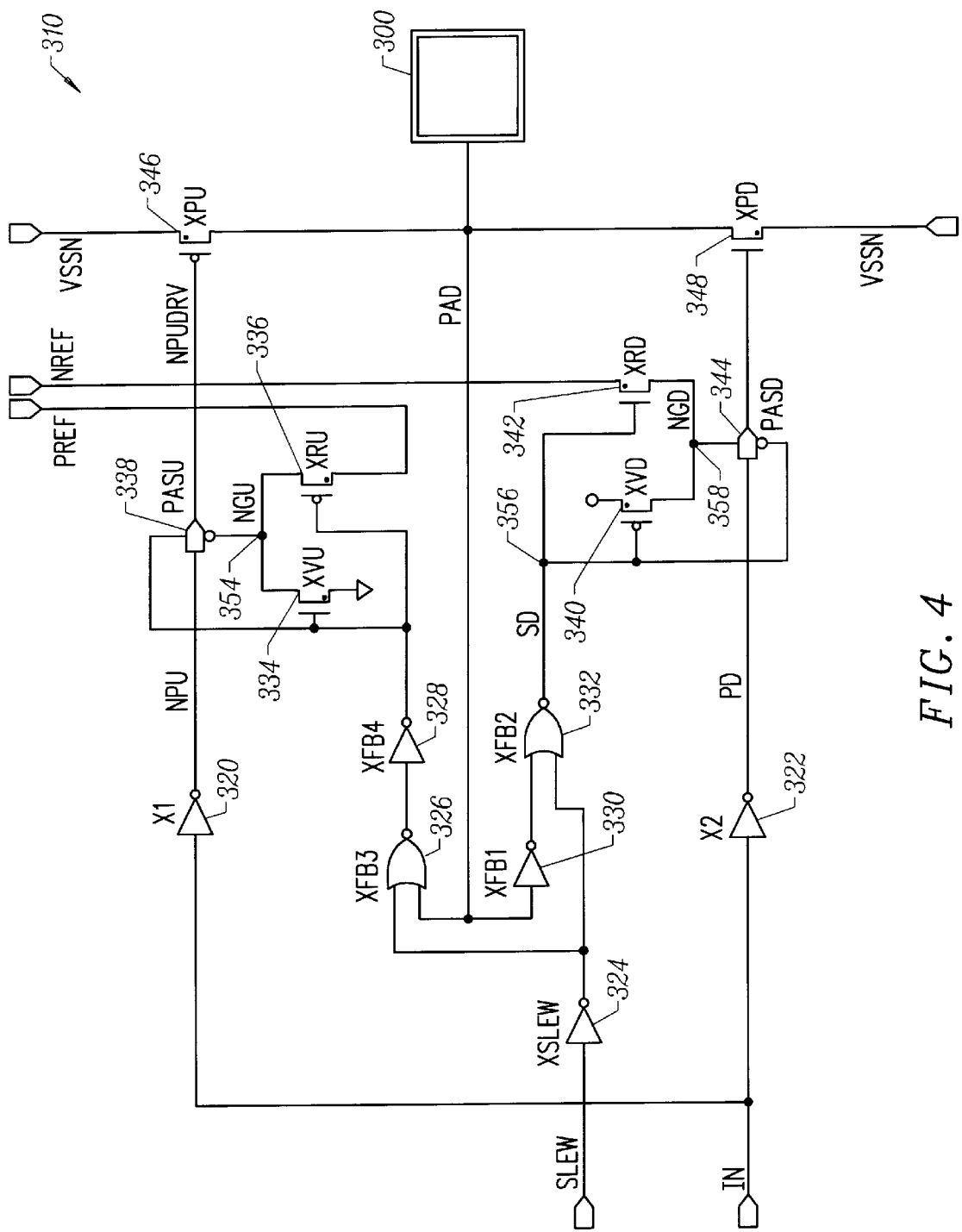
FIG. 4 is a simplified schematic diagram of another output buffer with ground bounce and power bounce reduction circuits.

FIGS. 1, 3, and 4 show various embodiments of output buffers with features of the present invention for reducing ground or power bounce noise, or both. In one set of embodiments, the ground and power bounce reduction features are incorporated in the design of the output buffer. In another set of embodiments, a SLEW signal provides programmability of the bounce reduction circuits.

FIG. 1 shows a simplified schematic diagram of a circuit where a ground bounce reduction feature is incorporated in the design of the output buffer. An output buffer 110 includes a push-pull circuit that is made up of a pull-up driver (XPU) 130 and a pull-down driver (XPD) 132. Pull-up driver 130 is coupled to a node VCCN and a pad 100. Pull-down driver 132 is coupled to pad 100 and node VSSN. VCCN and VSSN are typically the positive supply and ground source, respectively, for the integrated circuit wherein output buffer 110 resides. However, to decouple (or isolate) the bounce noise generated by output buffer 110 from internal circuitry within the integrated circuit, output drivers 130 and 132 can be coupled to one set of supply sources (e.g., VCCN and VSSN) and the internal circuitry can be coupled to another set of supply sources (e.g., VCC and VSS).

A data input signal (IN) into output buffer 110 is coupled to the input of inverting buffers 120 and 122. Buffer 120 and 122 provide buffering of the input signal but may not be necessary in some circuit design. The output of buffer 120 is coupled to the control electrode of pull-up driver 130. The output of buffer 122 is coupled to the control electrode of a P-channel metal-oxide-semiconductor (PMOS) transistor 124 and to the control electrode of an NMOS transistor 126. PMOS transistor 124 is coupled between VCC and the input node of a pass device (PASD) 128. NMOS transistor 126 is coupled between the output node of pass device 128 and VSS. The output node of pass device 128 also couples to the control electrode of pull-down driver 132.

Figure 2:
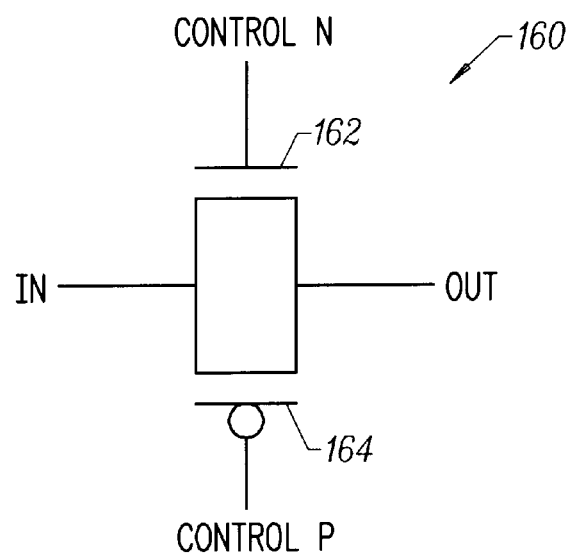
FIG. 2 is a schematic diagram of an implementation of a pass device or transmission gate.

FIG. 2 shows a schematic diagram of an implementation of a pass device 160 using a transmission gate. Pass device 160 includes an NMOS transistor 162 and a PMOS transistor 164 that are coupled in parallel between an input node (IN) and an output node (OUT) of pass device 160. The control electrode of NMOS transistor 162 is the CONTROL_N node of pass device 160 and the control electrode of PMOS transistor 164 is the CONTROL_P node of pass device 160. FIG. 2 illustrates just one implementation of a pass device. The pass device can be also be implemented with other circuits (e.g., a switch) and using other configurations.

Referring back to FIG. 1, pass device 128 can be implemented with pass device 160 as shown in FIG. 2. The CONTROL_N node of pass device 128 is coupled to an intermediate voltage VREFN and the CONTROL_P node of pass device 128 is coupled to another intermediate voltage VREFP. The CONTROL_N and CONTROL_P nodes may also be coupled to the supply sources. However, coupling of the CONTROL_N and CONTROL_P nodes to VREFN and VREFP, respectively, reduces the current drive of pass device 160. The input and output nodes of pass device 128 correspond to the IN and OUT nodes, respectively, in FIG. 2.

The intermediate voltages are voltages between the supply source voltages (i.e., between VCC and VSS) and are generated by one or more bias circuits. The bias circuits can be designed to provide the desired circuit characteristics (i.e., low output impedance, high output drive capability, and so on) and implemented using transistors, resistors, and other circuit elements. The bias circuit can be coupled to either VCCN/VSSN or VCC/VSS, although coupling to VCCN/VSSN can reduce the amount of noise on the bias circuit output.

Output buffer 110 is an inverting buffer which provides a logic high or a logic low at pad 100 depending on the state of the data input signal IN. For example, when IN is a logic low, pad 100 is a logic high. Alternatively, when IN is a logic high, pad 100 is a logic low.

Output buffer 110 incorporates a control circuit to reduce amount of ground bounce noise. The control circuit operates to effectively reduce the output current and the rate of change in the output current (di/dt) of pull-down device 132 during the transition from a logic high to a logic low at pad 100, thus reducing ground bounce.

Output buffer 110 operates in the following manner. When the data input signal IN of output buffer 110 transitions from logic low to logic high, a low voltage is provided at the output of buffer 120 and pull-up driver 130 is turned off. A low voltage is also provided at the output of buffer 122. This low voltage turns on PMOS transistor 124 and turns off NMOS transistor 126.

Referring to FIG. 2, pass device 160 operates in the following manner. When the CONTROL_N node is a logic high and the CONTROL_P node is a logic low, NMOS transistor 162 and PMOS transistor 164 are both turned on and pass device 160 behaves as a short. The short allows transmission of the signal at the input node IN to be provided to the output node OUT. However, when at least one of the control nodes is at an intermediate voltage, transistors 162 and 164 are not fully turned on, thus resulting in an intermediate voltage at the output node OUT. The intermediate voltage at the control node also causes pass device 160 to behave as a resistive device having a resistive value between the input and output nodes.

Referring back to FIG. 1, because the control nodes of pass device 128 are coupled to the intermediate voltages VREFN and VREFP, pass device 128 behaves as a resistive device and provides an intermediate voltage to the control electrode of pull-down driver 132. The intermediate drive voltage at the control electrode of pull-down driver 132 results in less output current and reduces the amount of ground bounce noise. Additionally, the intermediate drive voltage at the control electrode of pull-down driver 132 is slew rate limited by the impedance of pass device 128 and a parasitic capacitance at a node 134. By limiting the slew rate of the drive voltage, the slew rate of the output current is also limited correspondingly. This scheme greatly reduces ground bounce.

Pass device 128 does not affect the operation of pull-down driver 132 during transitions from logic low to logic high at pad 100. When the data input signal IN of output buffer 110 transitions from logic high to logic low, the output of buffer 122 is a logic high which turns off PMOS transistor 124 and turns on NMOS transistor 326. The drive voltage provided by NMOS transistor 126 is not affected by pass gate 128 because it is provided directly to the control electrode of pull-down driver 132 (and not through pass device 128). Thus, pull-down driver 132 is quickly turned off.

The intermediate voltages VREFN and VREFP can be generated in one of many embodiments. One embodiment utilizes a voltage divider including of resistors or transistors. Precision intermediate voltages can be generated using operational amplifiers. The various embodiments to generate the intermediate voltages are within the scope of the present invention.

FIG. 3 is a simplified schematic diagram of an output buffer with ground bounce and power bounce reduction circuits. Furthermore, this circuit reduces ground and power bounce noise. An output buffer 210 includes a push-pull circuit, similar to the one shown in FIG. 1, which includes a pull-up driver (XPU) 246 and a pull-down driver (XPD) 248. Pull-up driver 246 is coupled to a node VCCN and a pad 200. Pull-down driver 248 is coupled to pad 200 and node VSSN.

The data input signal IN into output buffer 210 is coupled to the input of inverting buffers 220 and 222. The output of buffer 222 is coupled the input of an inverting buffer 224. The outputs of buffers 220 and 224 are coupled to the input nodes of pass devices 238 and 244, respectively. The output nodes of pass devices 238 and 244 are coupled to the control electrodes of pull-up driver 246 and pull-down driver 248, respectively. Pass devices 238 and 244 can be implemented as shown in FIG. 2.

A SLEW control signal is coupled to the input of an inverting buffer 226 and to one input of a NAND gate 230. The output of buffer 226 couples to one input, of a NOR gate 228. The other input of each of NOR gate 228 and NAND gate 230 is coupled to pad 200. The output of NAND gate 230 couples to the input of inverting buffer 232.

The output of NOR gate 228 couples to the CONTROL_P node of a pass device 238 and the control electrodes of a PMOS transistor 234 and an NMOS transistor 236. PMOS transistor 234 is coupled across VCC and the CONTROL_N node of pass device 238. NMOS transistor 236 is coupled across an intermediate voltage REF and the CONTROL_N node of pass device 238.

The output of buffer 232 couples to the CONTROL_P node of pass device 244 and the control electrodes of PMOS transistor 240 and NMOS transistor 242. PMOS transistor 240 is coupled across VCC and the CONTROL_N node of pass device 244. NMOS transistor 242 is coupled across the intermediate voltage REF and the CONTROL_N node of pass device 244.

Output buffer 210 reduces the amount of ground bounce noise by limiting the output current through pull-down driver 248 during a logic high to logic low transition at pad 200. Similarly, output buffer 210 reduces the amount of power bounce noise by limiting the output current through pull-up driver 246 during a logic low to logic high transition at pad 200. The slew rate of output buffer 210 is programmable using the SLEW control signal. When the SLEW signal is low, slew rate control is not enabled. And when the SLEW signal is high, slew rate control is enabled. The SLEW signal may be controlled by a signal internal or external to the integrated circuit. The SLEW signal may also be controlled by programmable options or a programmable memory, such as by EEPROM cell, EPROM cell, FLASH cell, anti-fuse, RAM cell, ferro-electric RAM cell memory, SRAM cell, and many others.

Output buffer 210 operates in the following manner. When slew rate control is not enabled (i.e., the SLEW signal is logic low), the outputs of NOR gate 228 and buffer 232 are at logic low. These logic low signals cause PMOS transistors 234 and 240 to be turned on, thus passing VCC through the respective PMOS transistors 234 and 240 to the CONTROL_N nodes of the respective pass devices 238 and 244. The CONTROL_P nodes of these pass devices 238 and 244 are at logic low because of their connection to the outputs of NOR gate 228 and buffer 232, respectively. Thus, pass devices 238 and 244 are fully turned on and there is no slew rate control for pull-up driver 246 and pull-down driver 248.

When slew rate control is enabled (i.e., the SLEW signal is logic high), the slew rate at pad 200 is limited accordingly. The drive of either pass device 238 or 244 is reduced, depending on whether the transition at pad 200 is from a logic low to a logic high or a logic high to a logic low. The drive of the pass device is reduced by providing an intermediate drive voltage to the control electrode and operating the pass device as a resistive device to slow down the slew rate of the drive voltage.

During a transition from logic high to logic low at pad 200, the drive of pass device 244 is reduced to reduce the amount of ground bounce noise. Initially, before the transition to logic low, pad 200 is at logic high. Thus, the output of NAND gate 230 is at logic low and the output of buffer 232 is at logic high.

The logic high at the output of buffer 232 reduces the drive of pass device 244 and causes pass device 244 to behave as a resistive device. The logic high signal turns off PMOS transistor 240 and turns on NMOS transistor 242, thus coupling the intermediate voltage VREF through NMOS transistor 242 to the CONTROL_N node of pass device 244. The logic high at the output of buffer 232 is also provided to the CONTROL_P node of pass device 244. Therefore, pass device 244 provides an intermediate drive voltage to the control electrode of pull-down driver 248. Pass device 244 also behaves as a resistive device that limits the slew rate of the drive voltage. These events limit the di/dt through pull-down driver 248 and reduce the amount of ground bounce noise.

After the transition has taken place and pad 200 is at a low voltage, the pad voltage is fed back through NAND gate 230 to change the operating state of pass device 244 to ensure that pull-down driver 248 is fully turned on to meet the output VOL specification. Specifically, the low voltage at pad 200 is provided to NAND gate 230 and causes the output of buffer 232 to transition low.

The logic low at the output of buffer 232 operates to fully turn on pass device 244. The logic low signal turns on PMOS transistor 240, thus coupling VCC through PMOS transistor 240 to the CONTROL_N node of pass device 244. The CONTROL_P node of pass device 244 is a logic low since it is coupled to the output of buffer 232. These control voltages fully turn on pass device 244, which enables the signal from the output of buffer 224 be fully coupled to the control electrode of pull-down driver 248, thus ensuring that pull-down driver 248 is fully turned on.

Also during the transition from logic high to logic low at pad 200, pass device 238 is turned on and does not affect the slew rate of pull-up driver 246. This configuration allows pull-up driver 246 to be turned off quickly to prevent a situation wherein both pull-up driver 246 and pull-down driver 248 are simultaneously turned on. Initially, before the transition to logic low, the logic high at pad 200 causes the output of NOR gate 228 to be at logic low. The connection of PMOS transistor 234, NMOS transistor 236, and pass device 236 is identical to that of PMOS transistor 240, NMOS transistor 242, and pass device 244. As described above, the logic low at the output of NOR gate 228 operates to turn on pass device 236, which allows pull-up driver 246 to be quickly turned off during the transition from logic high to logic low at pad 200.

During a transition from logic low to logic high at pad 200, the drive of pass device 238 is reduced. Initially, before the transition to logic high, pad 200 is at logic low and the output of NOR gate 228 is at logic high. As described above, the logic high at the output of NOR gate 228 causes pass device 238 to behave as a resistive device. Therefore, pass device 238 limits the slew rate of the drive voltage at the control electrode of pull-up driver 246. Furthermore, an intermediate drive voltage is provided at the output of pass device 238. These events limit the di/dt through pull-up driver 246 and reduce the power bounce noise.

Also during the transition from logic low to logic high at pad 200, the drive of pass device 244 is not reduced (i.e., pass device 244 can be turned on fully) and minimally affects the slew rate of pull-down driver 248. This configuration allows pull-down driver 248 to be turned off quickly. Initially, before the transition to logic high, the logic low at pad 200 causes the output of NAND gate 230 to be at logic high, causing a logic low at the output of buffer 232. This logic low operates to turn on pass device 244 which allows pull-down driver 248 to be quickly turned off during the transition from logic low to logic high at pad 200.

The values of the intermediate voltages affect the shape of the output waveform at pad 200. Specifically, as the intermediate voltages approach VCC, the slew rate control feature has less impact on the output waveform. Alternatively, as the intermediate voltages approach VSS, the output waveform levels off at a lower voltage, thus decreasing the slew rate (and the amount of bounce noise) with the corresponding tradeoff in poor waveform fidelity. Intermediate voltages of approximately (VCC+VSS)/2 can provide symmetry between the rising and falling edges at pad 200. However, other intermediate voltages (e.g., 3(VCC+VSS)/4, 2(VCC+VSS)/3, and so on) can also be used, depending on the desired waveform and the requirements of a particular design. These intermediate voltages can be generated by the bias circuits described above. The shape of the waveform at pad 200 can also be controlled by providing a time delay between pad 200 and gates 228 and 230. The delay can be provided by a resistor interposed in the feed back path between pad 200 and the gates. The feed back resistor can also serve to protect the gates against electro-static discharge (ESD) introduced at pad 200. Additionally, the waveform at pad 200 can be adjusted by selecting the appropriate sizes for pass devices 238 and 244.

Since the signal at pad 200 is provided to NOR gate 228 and NAND gate 230, and since the voltage at pad 200 may not be at the proper signal level (i.e., not meeting the VOL and VOH specifications) during the period when slew rate control is enabled, the logic trigger point of these gates can be adjusted to optimize performance.

FIG. 4 is a simplified schematic diagram of another embodiment of an output buffer with ground bounce and power bounce reduction circuits. A P-MOS pull-up driver may be used to provide a higher output voltage level (e.g., $V_{OH}$). For example, a P-MOS pull-up driver is useful for interfacing with CMOS logic circuits that have greater $V_{IH}$ levels than TTL logic circuits. An output buffer 310 is a non-inverting output buffer that also reduces ground and power bounce noise, similar to the embodiment shown in FIG. 3. Output buffer 310 includes a push-pull circuit, similar to the one shown in FIG. 1, which includes a P-MOS pull-up driver (XPU) 346 (instead of N-MOS pull-up driver 246 of FIG. 3) and a pull-down driver (XPD) 348. Pull-up driver 346 is coupled to a node VCCN and a pad 300. Pull-down driver 348 is coupled to pad 300 and a node VSSN.

The data input signal (IN) into output buffer 310 is coupled to the input of inverting buffers 320 and 322. The output of buffer 320 is coupled the input node of a pass device 338, and the output of buffer 322 is coupled to the input node of a pass device 344. The output nodes of pass devices 338 and 344 are coupled to the control electrodes of pull-up driver 346 and pull-down driver 348, respectively. Pass devices 338 and 344 can be implemented as shown in FIG. 2.

The SLEW control signal is coupled to the input of inverting buffer 324. The output of buffer 324 couples to one input of each of NOR gates 326 and 332. Pad 300 couples to the other input of NOR gate 326 and the input of an inverting buffer 330. The output of buffer 330 couples to the other input of NOR gate 332. The output of NOR gate 326 couples to the input of inverting buffer 328.

The output of buffer 328 couples to the CONTROL_N node of pass device 338 and the control electrodes of NMOS transistor 334 and PMOS transistor 336. NMOS transistor 334 is coupled across a node 354 and GND, and PMOS transistor 336 is coupled across an intermediate voltage PREF and node 354. The CONTROL_P node of pass device 338 also couples to node 354.

The output of NOR gate 332 couples to the CONTROL_P node of pass device 344 and the control electrodes of PMOS transistor 340 and NMOS transistor 342. PMOS transistor 340 is coupled across VCC node 358, and NMOS transistor 342 is coupled across an intermediate voltage NREF and node 358. The CONTROL_N node of pass device 344 couples to node 358.

Output buffer 310 reduces the amount of ground bounce noise by limiting the output current through pull-down driver 348 during a logic high to a logic low transition at pad 300. Similarly, output buffer 310 reduces the amount of power bounce noise by limiting the output current through pull-up driver 346 during a logic low to a logic high transition at pad 300. The slew rate of output buffer 310 is programmable using the SLEW control signal. When the SLEW signal is low, slew rate control is not enabled. And when the SLEW signal is high, slew rate control is enabled.

Output buffer 310 operates in the following manner. When slew rate control is not enabled (i.e., the SLEW signal is logic low), the output of buffer 328 is at logic high. This logic high causes NMOS transistor 334 to be turned on, thus passing GND through NMOS transistors 334 to the CONTROL_P node of pass device 338. The CONTROL_N node of pass device 338 is at logic high because of its connection to the output of buffer 328. Thus, pass device 338 is fully turned on and there is no slew rate control for pull-up driver 346.

Similarly, the output of NOR gate 332 is at logic low when the slew rate control is not enabled. This logic low causes PMOS transistor 340 to be turned on, thus passing VCC through PMOS transistors 340 to the CONTROL_N node of pass device 344. The CONTROL_P node of pass device 3344 is at logic low because of its connection to the output of NOR gate 332. Thus, pass device 344 is fully turned on and there is no slew rate control for pull-down driver 348.

When slew rate control is enabled (i.e., the SLEW signal is logic high), the slew rate at pad 300 is limited accordingly. The drive of either pass device 338 or 344 is reduced, depending on whether the transition at pad 300 is from a logic low to a logic high or a logic high to a logic low.

During a transition from logic high to logic low at pad 300, the drive of pass device 344 is reduced to reduce the amount of ground bounce noise. Initially, before the transition to logic low, pad 300 is at logic high. Thus, the output of NOR gate 332 is at logic high. The logic high signal turns off PMOS transistor 340 and turns on NMOS transistor 342, thus coupling the intermediate voltage NREF through NMOS transistor 342 to the CONTROL_N node of pass device 344. The logic high at the output of NOR gate 332 is also provided to the CONTROL_P node of pass device 344. Therefore, pass device 344 provides an intermediate voltage to the control electrode of pull-down driver 348. Pass gate 344 also behaves as a resistive device that Limits the slew rate of the drive voltage. These events limit the di/dt through pull-down driver 348 and reduce the ground bounce noise.

After the transition has taken place and pad 300 is at a low voltage, the pad voltage is fed back through buffer 330 and NOR gate 332 to change the operating state of pass device 344. The feedback ensures that pull-down driver 348 is fully turned on to meet the output VOL specification. Specifically, the low voltage at pad 300 causes the output of NOR gate 332 to transition low. As described above, the logic low at the output of buffer 332 causes pass device 344 to be fully turned on. This enables the signal at the output of buffer 322 be fully coupled to the control electrode of pull-down driver 348 and ensures that pull-down driver 348 is fully turned on.

Also during the transition from logic high to logic low at pad 300, pass device 338 is turned on and does not affect the slew rate of pull-up driver 346. This allows pull-up driver 346 to be turned off quickly.

During a transition from logic low to logic high at pad 300, the drive of pass device 338 is reduced to reduce the amount of power bounce. Initially, before the transition to logic high, pad 300 is at logic low. Thus, the output of NOR gate 326 is at logic high and the output of buffer 328 is at logic low. The logic low signal reduces the drive of pass device 338. The logic low signal turns off NMOS transistor 334 and turns on PMOS transistor 336. This causes coupling the intermediate voltage VREF through PMOS transistor 336 to the CONTROL_P node of pass device 338. The logic low at the output of buffer 328 is also provided to the CONTROL_N node of pass device 338. Therefore, pass device 338 provides an intermediate voltage to the control electrode of pull-up driver 346. Pass gate 338 also behaves as a resistive device that limits the slew rate of the drive voltage. These events limit the di/dt through pull-up driver 346 and reduce the power bounce noise.

After the transition has taken place and pad 300 is at a high voltage, the pad voltage is fed back through NOR gate 326 to change the operating state of pass device 338 to ensure that pull-up driver 346 is fully turned on to meet the output VOH specification. Specifically, the high voltage at pad 300 causes the output of NOR gate 326 to transition low and output of buffer 328 to transition high. As described above, the logic high at the output of buffer 328 causes pass device 338 to be fully turned on. This enables the signal at the output of buffer 328 be fully coupled to the control electrode of pull-up driver 346 and ensures that pull-up driver 346 is fully turned on.

Also during the transition from logic low to logic high at pad 300, pass device 344 is turned on and does not affect the slew rate of pull-down driver 348. This allows pull-down driver 348 to be turned off quickly.

The output buffer as described above is suitable for many applications, including for programmable logic devices (PLDs), erasable programmable logic devices (EPLDs), electronically erasable programmable logic devices (EEPLDs), programmable array logic (PLA), field programmable array logic (FPLA), logic cell array (LCA), field programmable gate array (FPGA). These various devices are further described in U.S. Pat. No. 5,572,148, entitled "PROGRAMMABLE LOGIC ARRAY INTEGRATED CIRCUIT WITH GENERAL-PURPOSE MEMORY CONFIGURABLE AS A RANDOM ACCESS OR FIFO MEMORY", issued Nov. 5, 1996, and U.S. Pat. No. 5,557, 217, entitled "HIGH-DENSITY ERASABLE PROGRAMMABLE LOGIC DEVICE ARCHITECTURE USING MULTIPLEXER INTERCONNECTIONS", issued Sep. 17, 1996, both assigned to the assignee of the present invention, and incorporated herein by reference.

The previous description of the specific embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest, scope consistent with the principles and novel features disclosed herein.

What is claimed is:

1. An integrated circuit comprising:
    a driver device coupled between a power supply voltage and a pad; and
    a pass device coupled to a control electrode of the driver device, wherein in a first mode, the pass device is partially on and in a second mode, the pass device is fully on.

2. The integrated circuit of claim 1 wherein in the first mode, a control electrode of the pass device is coupled to an intermediate voltage, below the power supply voltage and above a ground voltage.

3. The integrated circuit of claim 1 wherein in the second mode, a control electrode of the pass device is coupled to the power supply voltage.

4. The integrated circuit of claim 3 wherein in the pass device is an NMOS transistor.

5. The integrated circuit of claim 1 wherein in the second mode, a control electrode of the pass device is coupled to a ground voltage.

6. The integrated circuit of claim 5 wherein the pass device is a PMOS transistor.

7. The integrated circuit of claim 1 further comprising:
    a programmable cell to control operation of the pass device.

8. The integrated circuit of claim 1 wherein operation of the pass device depends on a signal transition at the pad.

9. The integrated circuit of claim 1 wherein operation of the pass device depends on a signal at the pad.

10. The integrated circuit of claim 1 wherein operation of the pass device changes from the first mode to the second mode during a signal transition at the pad.

11. The integrated circuit of claim 1 wherein when the driver device is operated in a slow slew rate mode, the pass device is operated in the first mode.

12. The integrated circuit of claim 1 wherein the pass device is not off when the integrated circuit is supplied with power.

13. The integrated circuit of claim 1 further comprising:
    a first transistor coupled between a control electrode of the pass device and an intermediate voltage node; and
    a second transistor coupled between the control electrode of the pass device and the power supply voltage.

14. The integrated circuit of claim 13 wherein the first transistor is PMOS and the second transistor is NMOS.

15. The integrated circuit of claim 13 further comprising:
    a NOR gate coupled to control electrodes of the first and second transistors, wherein the NOR gate has an input coupled to the pad.

16. The integrated circuit of claim 1 further comprising:
    a first transistor coupled between a control electrode of the pass device and an intermediate voltage node; and
    a second transistor coupled between the control electrode of the pass device and a second power supply voltage, different from the power supply voltage coupled to the driver device.

17. The integrated circuit of claim 16 further comprising:
a NAND gate having an input coupled to the pad; and
an inverter coupled between the NAND gate and control electrodes of the first and second transistors.

18. The integrated circuit of claim 1 wherein the driver device is an NMOS transistor.

19. An output buffer circuit comprising:
a driver device coupled between a first supply voltage and a pad;
a pass device coupled to a first control electrode of the driver device;
a first transistor coupled between a second supply voltage and a second control electrode of the pass device; and
a second transistor coupled between a third voltage and the second control electrode.

20. The circuit of claim 19 wherein the third voltage is between the first and second supply voltages.

21. The circuit of claim 19 wherein the first transistor is NMOS and the second transistor is PMOS.

22. The circuit of claim 19 wherein further comprising:
a logic gate coupled between the pad and a third control electrode of the first transistor and a fourth control electrode of the second transistor.

23. The circuit of claim 19 wherein the driver device is a PMOS transistor.

24. The circuit of claim 19 wherein the pass device is a PMOS transistor.

25. The circuit of claim 19 wherein the pad is at or below a threshold level, the second control electrode is coupled through the second transistor to the third voltage.

26. The circuit of claim 19 wherein the pad is at or above a threshold level, the second control electrode is coupled through the first transistor to the second supply voltage.

27. An output buffer circuit comprising:
a first driver coupled between a first supply voltage and a pad;
a second driver coupled between a second supply voltage and the pad;
a first pass device coupled to a first control electrode of the first driver;
a second pass device coupled to a second control electrode of the second driver;
a first transistor coupled between a third voltage and a third control electrode of the first pass device; and
a second transistor coupled between a fourth voltage and a fourth control electrode of the second pass device.

28. The circuit of claim 27 wherein the third and fourth voltages are at different voltage levels, both between the first and second supply voltages.

29. The circuit of claim 27 wherein the first driver and second driver are different transistor types.

30. The circuit of claim 27 further comprising:
a first logic gate coupled between the pad and the first transistor; and
a second logic gate coupled between the pad and the second transistor.

31. An output buffer circuit comprising:
a first driver coupled between a first supply voltage and a pad;
a second driver coupled between a second supply voltage and the pad;
a first pass device coupled to a first control electrode of the first driver;
a second pass device coupled to a second control electrode of the second driver;
a first transistor coupled between a third voltage and a third control electrode of the first pass device; and
a second transistor coupled between the third voltage and a fourth control electrode of the second pass device.

32. The circuit of claim 31 wherein the third voltage is between the first and second supply voltages.

33. The circuit of claim 31 wherein the first and second driver are similar device types.

34. The circuit of claim 31 further comprising:
a first logic gate coupled between the pad and the first transistor; and
a second logic gate coupled between the pad and the second transistor.

35. An output buffer circuit comprising:
a driver device coupled between a first supply voltage and a pad;
a pass device coupled to a first control electrode of the driver device;
a first transistor coupled between the first supply voltage and a second control electrode of the pass device;
a second transistor coupled between a second voltage and the second control voltage; and
a logic gate coupled between the pad and a third control electrode of the first transistor and a fourth control electrode of the second transistor.

36. The circuit of claim 35 wherein the second voltage is between the first supply voltage and a third supply voltage.

37. The circuit of claim 35 wherein the first transistor is PMOS and the second transistor is NMOS.

38. The circuit of claim 35 wherein the driver device is an NMOS transistor.

39. The circuit of claim 35 wherein the pass device is an NMOS device.

40. The circuit of claim 35 wherein when the pad is at or above a threshold level, the second control electrode is coupled through the second transistor to the second voltage.

41. The circuit of claim 35 wherein when the pad is at or below a threshold level, the second control electrode is coupled through the first transistor to the first supply voltage.

* * * * *